United States Patent
Lee et al.

(10) Patent No.: US 6,841,425 B2
(45) Date of Patent: Jan. 11, 2005

(54) WAFER TREATMENT METHOD FOR PROTECTING FUSE BOX OF SEMICONDUCTOR CHIP

(75) Inventors: Jae-Il Lee, Chungcheongnam-do (KR); Jeong-Ho Bang, Kyungki-do (KR); Young-Moon Lee, Kyungki-do (JP); Hyo-Geun Chae, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 12 days.

(21) Appl. No.: 10/282,741

(22) Filed: Oct. 28, 2002

(65) Prior Publication Data

US 2003/0080360 A1 May 1, 2003

(30) Foreign Application Priority Data

Oct. 30, 2001 (KR) .......................................... 2001-67136

(51) Int. Cl.[7] .............................................. H01L 21/82
(52) U.S. Cl. ..................... 438/132; 438/601; 257/529
(58) Field of Search ................................ 438/132, 601; 257/529

(56) References Cited

U.S. PATENT DOCUMENTS

| | | | | |
|---|---|---|---|---|
| 4,652,480 A | * | 3/1987 | Kato et al. ............... | 428/65.5 |
| 5,601,905 A | * | 2/1997 | Watanabe et al. ........... | 428/215 |
| 6,171,980 B1 | * | 1/2001 | Crabtree et al. ............ | 438/781 |
| 6,225,240 B1 | * | 5/2001 | You et al. .................... | 438/782 |
| 6,235,551 B1 | * | 5/2001 | Farnworth et al. .......... | 438/106 |
| 6,339,250 B1 | * | 1/2002 | Ido et al. .................... | 257/529 |
| 6,537,719 B1 | * | 3/2003 | Takahashi ................... | 430/191 |
| 6,610,590 B2 | * | 8/2003 | Otaki .......................... | 438/612 |

FOREIGN PATENT DOCUMENTS

JP           08012914 A  *  1/1996  ........... C09D/11/10

* cited by examiner

*Primary Examiner*—John F. Niebling
*Assistant Examiner*—Jennifer M. Kennedy
(74) *Attorney, Agent, or Firm*—Marger Johnson & McCollom, P.C.

(57) ABSTRACT

Methods for treating a wafer to protect a fuse box of a semiconductor chip are provided. These methods include applying an insulating coating solution onto the surface of at least one of a plurality of fuse boxes in a semiconductor chip so as to prevent moisture or impurities from seeping into the fuse box. With these methods, the degradation of the semiconductor chip can be substantially reduced by protecting the fuse box from a high-temperature and very humid atmosphere, and impurities such as particles. Thus, characteristics and reliability of the semiconductor chip can be also improved.

7 Claims, 5 Drawing Sheets

WAFER TREATMENT METHOD FOR PROTECTING FUSE BOX OF SEMICONDUCTOR CHIP

This application claims priority from Korean Patent Application No. 2001-0067136, filed on Oct. 30, 2001, the contents of which are incorporated herein by this reference in their entirety.

BACKGROUND OF THE INVENTION

1. Field of the Invention

The present invention relates to a method for treating a wafer, and more particularly, to a method for treating a wafer to protect a fuse box of a semiconductor chip, thereby preventing the degradation of the semiconductor chip.

2. Description of the Related Art

During the manufacture of semiconductor chips, redundancy memory cells are formed in each sub-array block. For instance, cells corresponding to redundant rows and columns are formed in each 256 K cell array. After the fabrication of semiconductor chips is completed, a wafer-level electrical test is performed thereon to sort out the defective semiconductor chips. Then, good semiconductor chips are selected, assembled, and packaged. The defective chips that are detected during the electrical test, however, can be repaired through a repair process. In the repair process, a defective memory cell is replaced with a redundancy memory cell. This is realized by cutting a proper fuse so that the selected line of a defective memory cell is replaced with the line of a redundancy cell when an address signal corresponding to the line of the defective memory cell is input during the later use of a semiconductor chip. An excessive current and laser beam is typically used in cutting the fuse. In particular, the use of a laser beam is preferred because it is simple and reliable and easy to lay out the fuse.

A semiconductor chip includes a variety of fuses, including fuses used during the repair process, e.g., a fuse for trimming the level of a DC generator, a fuse for selecting a chip, and an oscillator fuse. A region occupied by these fuses is referred to as a 'fuse box' and described with respect to its schematic structure while referring to FIGS. 1 and 2.

FIG. 1 is a plan view of a general fuse box 100. As shown in FIG. 1, the fuse box 100 is placed on a wafer W and may include a plurality of fuses 10. Each fuse 10 is arranged in the vertical direction. The fuse box 100 of FIG. 1 is a rectangular-shaped fuse box having seven fuses 10. Reference numeral '50' denotes a blocking layer that prevents moisture from permeating through a cell array (not shown) from the fuse box 100.

FIG. 2 is a cross-sectional view of the fuse box 100 of FIG. 1, taken along line II–II'. Referring to FIG. 2, the blocking layer 50 is a multi-layered structure in which metal lines 25 and 35 are formed between insulating layers 20 and 30 and between the insulating layer 30 and a passivation layer 40, respectively.

In general, once the fabrication of a semiconductor chip is completed, a passivation layer such as polyimide is formed on a wafer to protect the semiconductor chip, prior to a wafer-level electrical test. However, a passivation layer that covers a contact pad and a fuse box need to be removed to expose the contact pad and the fuse box, for example, during the wafer-level electrical test in which an electrical signal is applied onto the contact pad, and during the repair process in which a fuse is cut.

Although the fuse box 100 of FIG. 1 has the blocking layer 50, it is not possible to sufficiently prevent the cell array from being moistened when a void occurs in the metal lines 25 and 35. As the semiconductor chip is being manufactured, a native oxide layer may be formed on the surface of an exposed fuse. The oxide layer is prone to being formed at irregular intervals or formed incompletely, and, thus, is not capable of preventing moisture permeating through the fuse box.

Furthermore, unlike the cell region covered with a passivation layer, a fuse box is not protected with a passivation layer. Thus, the fuse box is vulnerable to a high-temperature atmosphere and impurities such as dust, which can lead to the malfunction of a particular chip. For example, if moisture gets into the fuse box, a fuse in the fuse box is eroded. Also, if the fuse box is exposed to the high-temperature atmosphere, the volume of the fuse box expands, causing a crack in the fuse box. When assembling a multi-chip, a crack in the fuse box may cause the chip to be damaged or degraded if a physical stress is applied onto the chip. Also, short circuit may occur if impurities undesirably enter into the fuse box.

Accordingly, there is a need for overcoming these problems to improve the lifetime and reliability of highly-integrated semiconductor circuit chips.

SUMMARY OF THE INVENTION

The present invention provides, for example, a method for treating a wafer such that fuse boxes can be protected from moisture, thus preventing the degradation of a semiconductor chip.

According to an embodiment of the present invention, an insulating coating solution is applied onto the surface of at least one of the fuse boxes so that moisture or impurities do not enter into the fuse box of the semiconductor chip.

Here, the application of the coating solution may be performed after performing a wafer-level electrical test. Also, the application of the coating solution may be performed after trimming a fuse, cutting a fuse, or performing a repair process. The coating solution is applied onto the fuse box to a thickness of, e.g., from about several to several tens of microns, such that the degradation of the fuse box can be prevented even if the semiconductor chip is exposed to a high-temperature and very humid atmosphere. In this method, various coating solutions can be used, e.g., polyimide, UV ink, and IR ink. When applying the coating solution, the coating solution may be applied onto the fuse box by a scanning method, using a fine brush.

With the present invention, a fuse box can be protected from a high-temperature and very humid atmosphere, and impurities such as particles, thereby reducing damage or stresses applied onto the fuse box. As a result, degradation of a semiconductor chip can be prevented.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1:
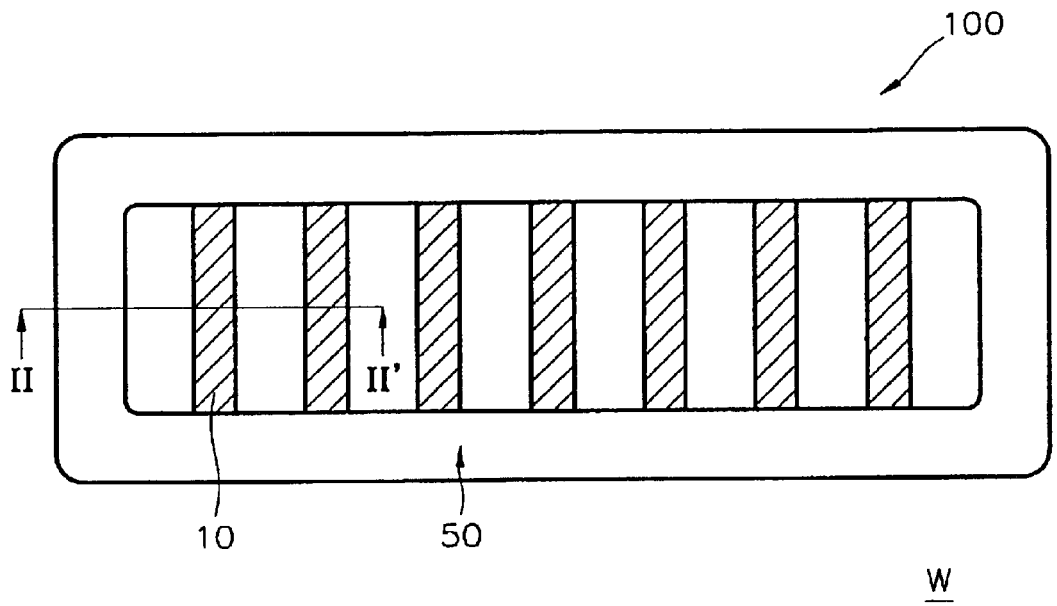
FIG. 1 is a plan view of a conventional fuse box.
Figure 2:
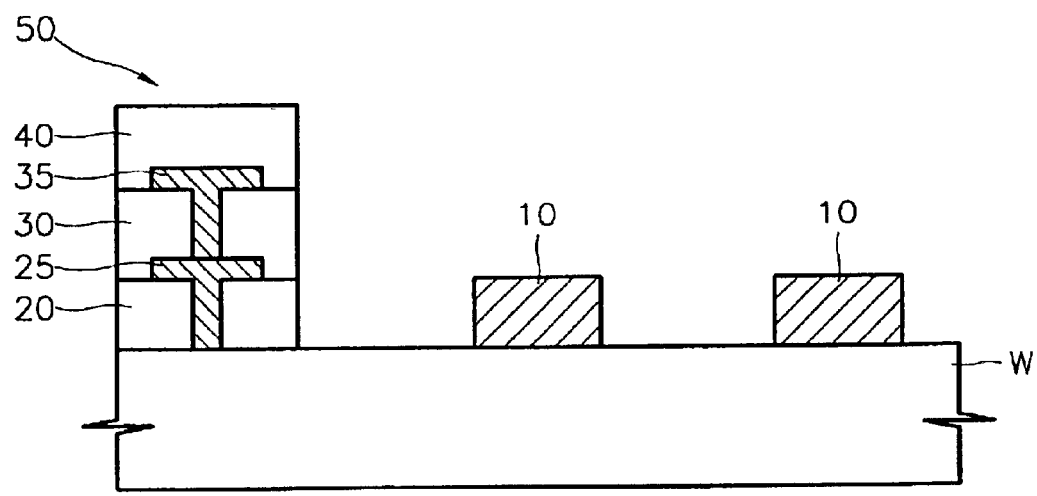
FIG. 2 is a cross-sectional view of the fuse box of FIG. 1, taken along line II–II'.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art. In the drawings, the size or shape of components is exaggerated for clarity. The same reference numerals in different drawings represent the same elements, and thus their descriptions will be omitted.

Figure 3:
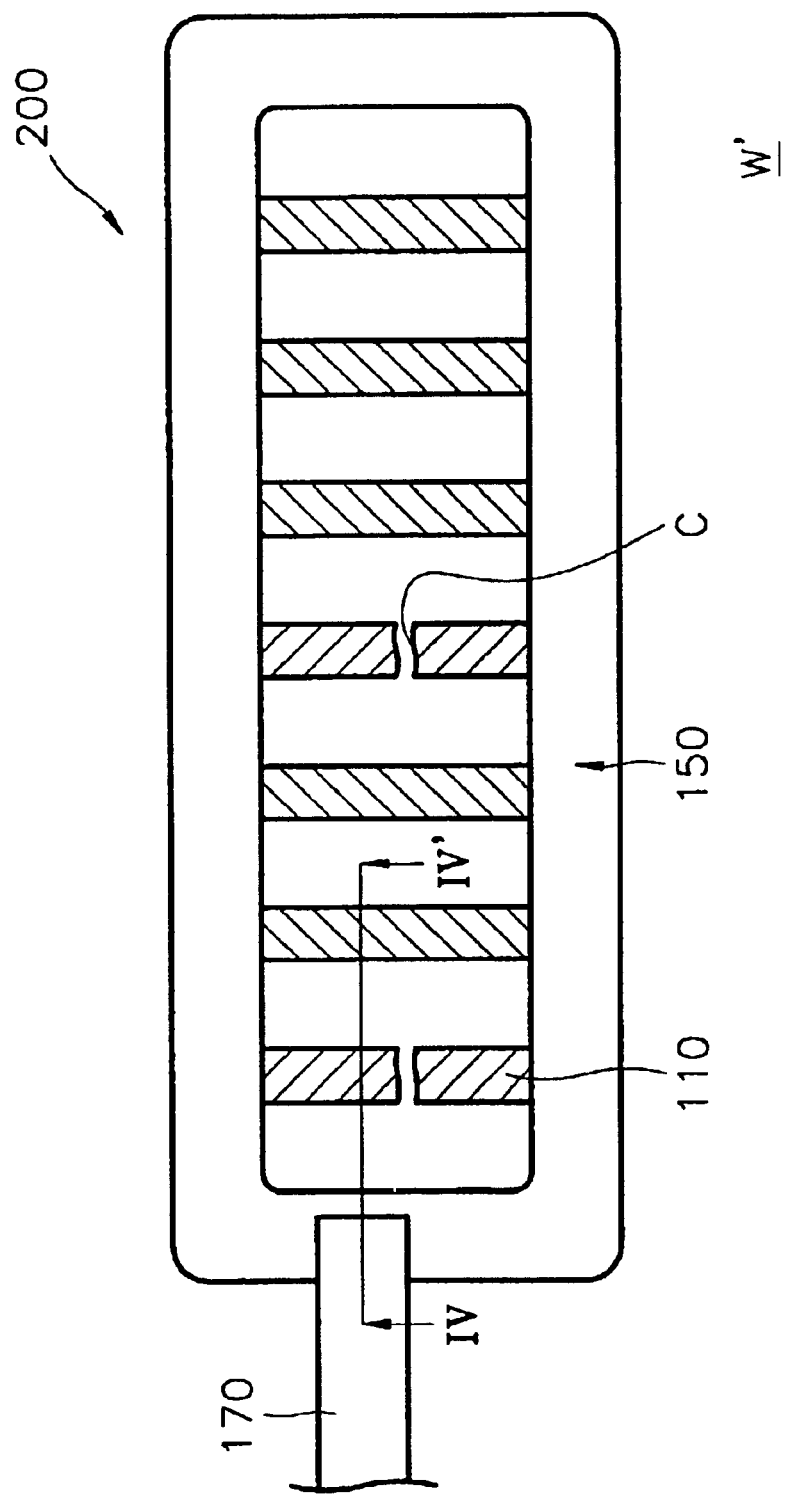
FIG. 3 is a plan view of a fuse box for explaining a method for treating a wafer according to an embodiment of the present invention.
Figure 4:
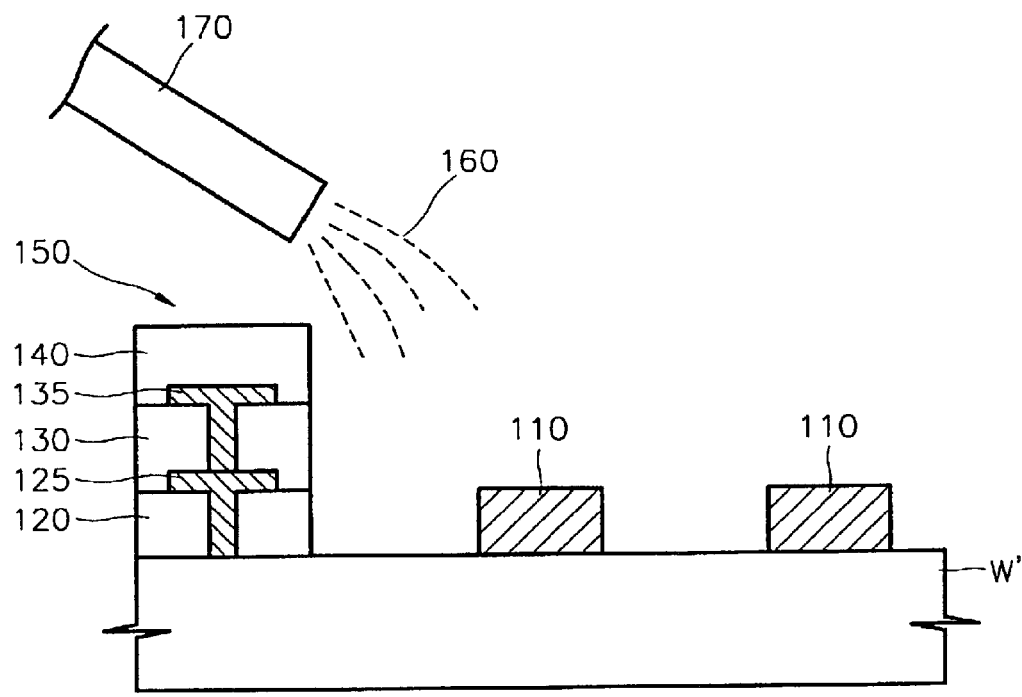
FIGS. 4 and 5 are cross-sectional views of the fuse box of FIG. 3, taken along line IV–IV'.
Figure 5:
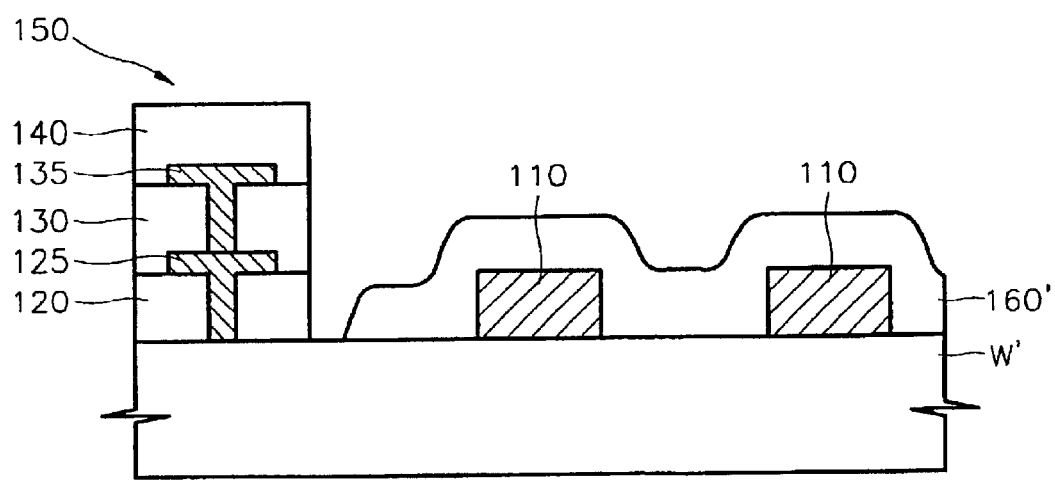

FIG. 3 is a top view of a fuse box for explaining a method for treating a wafer according to an embodiment of the present invention. FIGS. 4 and 5 are cross-sectional views of the fuse box of FIG. 3, taken along the lines IV–IV'.

Referring to FIGS. 3 and 4, after performing a wafer-level electrical test on a processed semiconductor chip, an insulating coating solution 160 is applied onto a fuse box 200 having fuses 110. Some of the fuses (indicated by reference character 'C') are cut, for example, during a repair process or during a process of trimming the level of a DC generator. The coating solution 160 is sprayed onto the fuse box 200 via a fine nozzle 170 that is connected to a reservoir filled with the coating solution 160. The fine nozzle 170 can be any type of nozzle suitable for spaying the coating solution 160 onto the fuse box 200 without applying the coating solution 160 on the regions other than the fuse box 200. The coating solution 160 may be one of various insulators, e.g., polyimide, ultra-violet (UV) ink or infra-red (IR) ink. The coating solution 160 may be transparent. However, one skilled in the art will appreciate that the coating solution 160 may be translucent or opaque. Also, the coating solution 160 may have colors or may be colorless.

The fuse box 200 of FIG. 3 is formed on a substrate or wafer W' and include fuses 110. Each fuse 110 is preferably arranged in the vertical direction. In this embodiment, the fuses 110 include two cut fuses C, and the fuse box 200 is of a rectangular shape. Reference numeral '150' denotes a blocking layer formed to prevent moisture from permeating through a cell array (not shown) from the fuse box 200. The blocking layer 150 may be a multilayered structure in which metal lines 125 and 135 are formed between insulating layers 120 and 130 and between the insulating layer 130 and a passivation layer 140, respectively. The passivation layer 140 may be included as a top portion of the blocking layer 150 as illustrated in FIG. 4. Because a plurality of fuse boxes are included in a semiconductor chip, fuse boxes other than the fuse box 200 of FIG. 3 may be coated with the coating solution 160.

Referring to FIG. 5, the coating solution 160 is applied on the fuses 110 to form a coating layer 160' on the fuses 110. In some cases, the coating layer 160' may be formed to cover the blocking layer 150 as well as the fuses 110. The coating layer 160' may be formed to a thickness ranging from about several to several tens of microns, e.g., 5–30 μm, so that degradation of the fuse box 200 can be prevented even if the semiconductor chip is exposed to a high temperature and high humidity atmosphere.

In the above-described embodiment, with the coating layer 160', moisture or impurities can be prevented from entering into the fuse box 200, thereby preventing degradation of the semiconductor chip. Further, the fuses 110, in the fuse box 200, which are trimmed or repaired, can be well protected. Also, the fuse box 200 is not exposed directly to the high-temperature atmosphere owing to the coating layer 160', thereby preventing the occurrence of fine cracks. For this reason, damage or degradation of the semiconductor chip can be prevented even if a physical stress is applied on the fuse box 200 during the manufacture of a multi-chip package. As stated above, if the fine nozzle 170 is used for spraying the coating solution 160 evenly on the fuse box 200, it is possible to prevent unnecessary application of the coating solution 160 onto regions other than the fuse box 200.

Figure 6:
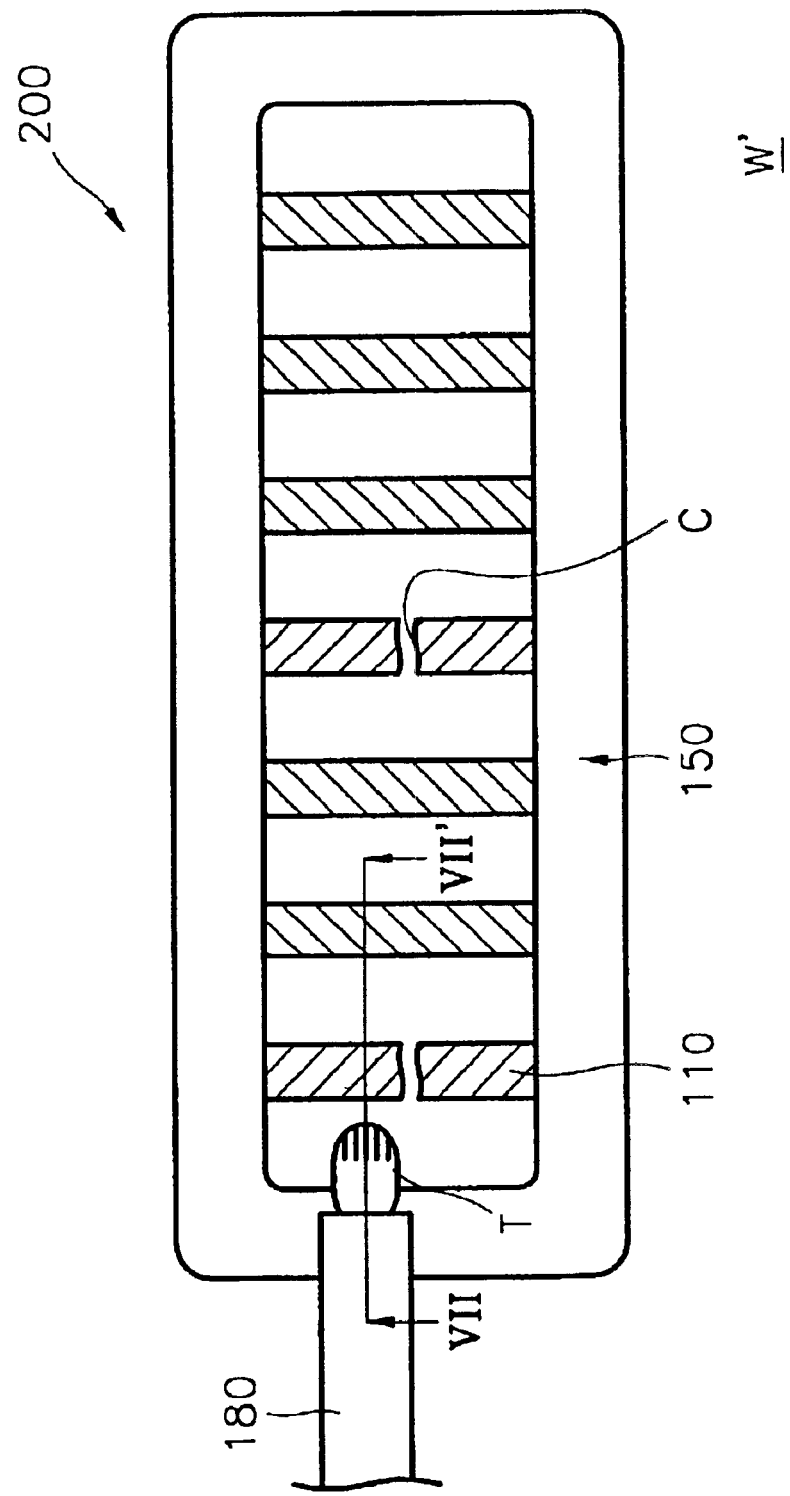
FIG. 6 is a top view of a fuse box for explaining a method for treating a wafer according to another embodiment of the present invention.
Figure 7:
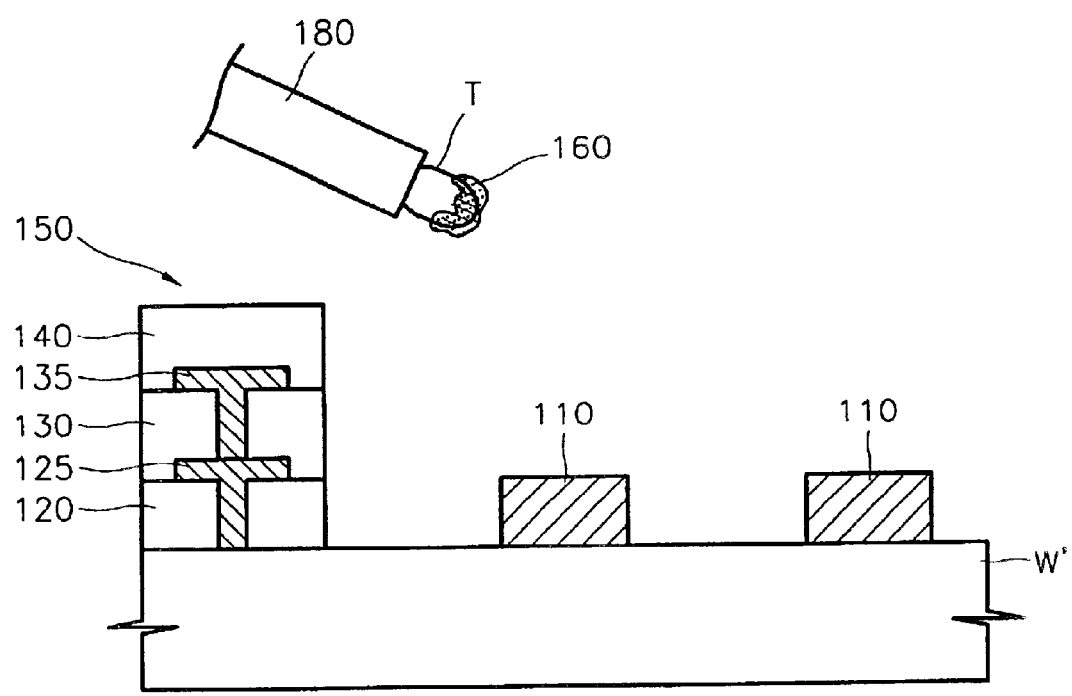
FIG. 7 is a cross-sectional view of the fuse box of FIG. 6, taken along line VII–VII'.

FIG. 6 is a plan view of a fuse box for explaining a method of treating a wafer according to another embodiment of the present invention. FIG. 7 is a cross-sectional view of the fuse box 200 of FIG. 6, taken along line VII–VII'. In this embodiment, elements that are identical or similar to those in the first embodiment are described with the same reference numerals, and their descriptions will be omitted for brevity.

Referring to FIGS. 6 and 7, the fuse box 200 is covered with a coating solution 160 through a scanning method, using a fine brush 180. The fine brush 180 may include means for continuously supplying the coating solution 160 to the tip T of the fine brush 180. Otherwise, a manufacturer may dip the tip T of the fine brush 180 into the coating solution 160 and then brush the coating solution 160 on the fuse box 200. The fine brush 180 can be any type of brush suitable for applying the coating solution 160 onto the fuse box 200 without applying the coating solution 160 on the regions other than the fuse box 200. The shape of a covered coating layer may be different from that of the coating layer 160' of FIG. 5. However, the effects of this embodiment are substantially the same as that of the above-described embodiment. One unique effect of this second embodiment is that the fuse box 200 is covered with the coating solution 160 through a scanning method, using the fine brush 180. Thus, the time period required to treat one fuse box can be reduced.

As described above, according to embodiments of the present invention, the fuse box 200 is not exposed directly to a high-temperature and/or very humid atmosphere and is, therefore, not moistened or polluted by impurities, thereby preventing the degradation of a semiconductor chip. Also, the characteristics of a semiconductor chip do not deteriorate because fuses, in the fuse box 200, which are trimmed or repaired, are well protected.

Further, even if the chip is exposed to a high-temperature and/or very humid atmosphere, the fuse box 200 is coated with a thick coating layer 160' such that degradation of the fuse box 200 can be prevented, thus reducing damage to the fuse box 200. Although physical stresses may be applied on the chip during the assembly of a multi-chip package, the fuse box 200 can be protected. Accordingly, the characteristics and reliability of a semiconductor chip can be enhanced, thereby substantially improving productivity.

While this invention has been particularly shown and described with references to preferred embodiments thereof, it will be understood by those skilled in the art that various changes in form and details may be made therein without departing from the spirit and scope of the invention as defined by the appended claims. For instance, the treatment process herein claimed can be performed on a fuse box in wafer or chip. The use of the term wafer is not intended to limit the application of the method or breadth of the claims.

What is claimed is:

1. A method of treating a wafer, the method comprising:
   applying an insulating coating solution onto a surface of at least one of a plurality of fuse boxes in a semiconductor chip so as to prevent moisture or impurities from entering into the fuse box without applying the coating solution on regions of the chip other than the at least one of a plurality of fuse boxes, wherein the coating solution is one of UV ink and IR ink.

2. The method of claim 1, wherein the application of the coating solution is carried out after trimming the fuses.

3. The method of claim 1, wherein the application of the coating solution is carried out after cutting or repairing the fuses.

4. The method of claim 1, wherein the coating solution is applied onto the fuse box to a thickness of about 5–30 $\mu$m.

5. The method of claim 1, wherein the coating solution is applied onto the fuse box with a fine nozzle during the application of the coating solution.

6. The method of claim 1, wherein the coating solution is applied onto the fuse box through a scanning method, using a fine brush, during the application of the coating solution.

7. The method of claim 1, wherein the application of the coating solution is performed after performing a wafer-level electrical test on the semiconductor chip.

* * * * *